(12) United States Patent
Meyer, IV et al.

(10) Patent No.: US 8,059,406 B1
(45) Date of Patent: Nov. 15, 2011

(54) HEAT SINK FOR MEMORY AND MEMORY DEVICE HAVING HEAT SINK

(75) Inventors: George Anthony Meyer, IV, San Jose, CA (US); Chien-Hung Sun, Zhongli (TW); Chieh-Ping Chen, Zhongli (TW); Hsien-Tsang Liu, Zhongli (TW)

(73) Assignee: Celsia Technologies Taiwan, Inc., Taoyuan (TW)

( * ) Notice: Subject to any disclaimer, the term of this patent is extended or adjusted under 35 U.S.C. 154(b) by 27 days.

(21) Appl. No.: 12/818,268

(22) Filed: Jun. 18, 2010

(51) Int. Cl.
*H05K 7/20* (2006.01)

(52) U.S. Cl. ............. 361/701; 361/679.53; 361/679.54; 361/700; 361/715; 361/679.46; 165/104.21; 165/104.26; 165/104.33

(58) Field of Classification Search ............ 361/679.46, 361/679.53, 679.54, 700–712, 715–724; 165/80.2, 80.3, 80.4, 80.5, 104.21, 104.26, 165/104.33, 104.34, 185; 174/15.1, 16.3, 174/252; 157/706–727

See application file for complete search history.

(56) References Cited

U.S. PATENT DOCUMENTS

| | | | |
|---|---|---|---|
| 7,079,396 B2 * | 7/2006 | Gates et al. | 361/719 |
| 7,151,668 B1 * | 12/2006 | Stathakis | 361/700 |
| 7,400,506 B2 * | 7/2008 | Hoss et al. | 361/715 |
| 7,626,823 B2 * | 12/2009 | Yang et al. | 361/719 |
| 7,639,498 B2 * | 12/2009 | Campbell et al. | 361/699 |
| 7,855,888 B2 * | 12/2010 | Peterson | 361/699 |
| 7,876,564 B2 * | 1/2011 | Monh et al. | 361/700 |
| 7,990,699 B2 * | 8/2011 | Lian et al. | 361/679.47 |
| 2008/0251911 A1 * | 10/2008 | Farnsworth et al. | 257/714 |
| 2009/0190304 A1 * | 7/2009 | Meyer et al. | 361/679.47 |

\* cited by examiner

*Primary Examiner* — Michail V Datskovskiy
(74) *Attorney, Agent, or Firm* — Chun-Ming Shih; HDLS IPR Services

(57) ABSTRACT

In a memory device and its heat sink, the memory device includes a memory, a heat sink mounted onto the memory and a clamping element, and the heat sink includes an isothermal vapor chamber plate and a heat dissipating body, and the isothermal vapor chamber plate is attached onto an external side of the memory and includes an insert portion, and the heat dissipating body includes a base plate, a plurality of heat dissipating fins extended from the base plate, and a pawl arm extended from the base plate and in an opposite direction of the fins, and the heat dissipating body is coupled to the insert portion in a replaceable manner by the pawl arm, and the clamping element is provided for clamping the base plate and the isothermal vapor chamber plate, such that the heat dissipating body can be replaced on the isothermal vapor chamber plate easily.

10 Claims, 6 Drawing Sheets

HEAT SINK FOR MEMORY AND MEMORY DEVICE HAVING HEAT SINK

BACKGROUND OF THE INVENTION

1. Field of the Invention

The present invention relates to a heat dissipating structure, in particular to a heat sink used in a memory device.

2. Description of Prior Art

To cope with the high-speed operation of processors, present memory modules tend to be developed with increasingly higher speed and frequency regardless of their operating clock or transmission bandwidth, such that the operating temperature of the memory modules becomes increasingly higher, and the heat produced becomes tremendously high. The continuous rising temperature may affect the operation performance of the memory or may even damage the memory modules.

In general, a conventional memory heat dissipating structure comprises a cooling plate, an isothermal vapor chamber plate and a heat dissipating body, wherein a surface of the isothermal vapor chamber plate is attached and coupled to the cooling plate, and another surface of the isothermal vapor chamber plate is attached and coupled to the memory module, and the heat dissipating body is installed onto the memory module and clamped between the cooling plate and the isothermal vapor chamber plate, and the heat dissipating body includes a base plate and a plurality of heat dissipating fins extended from the base plate, and the base plate is attached and coupled to the isothermal vapor chamber plate and clamped and fixed between the cooling plates by a fastener for dissipating the heat generated by the memory module, and the heat dissipating fins are in different forms provided for making a change by users according to different heat dissipation requirements.

In the aforementioned memory heat dissipating structure, although the heat dissipating fins can be changed to various forms according to different heat dissipation requirements, yet no clamping or positioning structure is installed between the heat dissipating body and the isothermal vapor chamber plate, so that it is necessary to hold the heat dissipating body by hand or use a tool for positioning them before the fastener is secured. This procedure makes the assembling and replacement processes more difficult.

In view of the foregoing drawbacks, the inventor of the present invention based on years of experience in the related industry to conduct extensive researches and experiments, and finally provided a feasible and effective design in accordance with the present invention.

SUMMARY OF THE INVENTION

Therefore, it is a primary objective of the present invention to provide a heat sink for a memory, so as to facilitate the replacement of a heat dissipating body on an isothermal vapor chamber plate and improve the convenience of the assembling process.

To achieve the foregoing objective, the present invention discloses a heat sink for a memory, and the heat sink comprises an isothermal vapor chamber plate and a heat dissipating body, wherein the isothermal vapor chamber plate is attached onto an external side of the memory and includes an insert portion, and the heat dissipating body includes a base plate, a plurality of fins extended from the base plate, and a pawl arm extended from the base plate towards the fins, and the heat dissipating body is coupled to the insert portion in a replaceable manner by the pawl arm.

Another objective of the present invention is to provide a memory device having a heat sink, wherein the form of a heat dissipating body can be changed according to different heat dissipation requirements to lower the level of difficulty of assembling and installing the heat sink.

To achieve the foregoing objective, the present invention provides a memory device having a heat sink, and the memory devices comprises a memory, an isothermal vapor chamber plate, a heat dissipating body and a clamping element, wherein the isothermal vapor chamber plate is attached onto an external side of the memory and includes an insert portion formed thereon, and the heat dissipating body includes a base plate, a plurality of fins extended from the base plate, and a pawl arm extended from the base plate and in an opposite direction of the fins, and the heat dissipating body is coupled to the insert portion in a replaceable manner by the pawl arm, and the clamping element is provided for clamping and fixing the base plate and the isothermal vapor chamber plate.

Compared with the prior art, the heat sink for memories and the memory device having the heat sink in accordance with the present invention include a pawl arm installed on the heat dissipating body, such that the heat dissipating body is clamped by the pawl arm and positioned onto the isothermal vapor chamber plate to achieve the effect of replacing the heat dissipating body easily. During the assembling process, it is not necessary to hold the heat dissipating body or use an additional tool, so that the invention provides a convenient assembling process.

DETAILED DESCRIPTION OF THE INVENTION

The detailed description and technical contents of the present invention will become apparent with the following detailed description accompanied with related drawings. It is noteworthy to point out that the drawings is provided for the illustration purpose only, but not intended for limiting the scope of the present invention.

Figure 1:
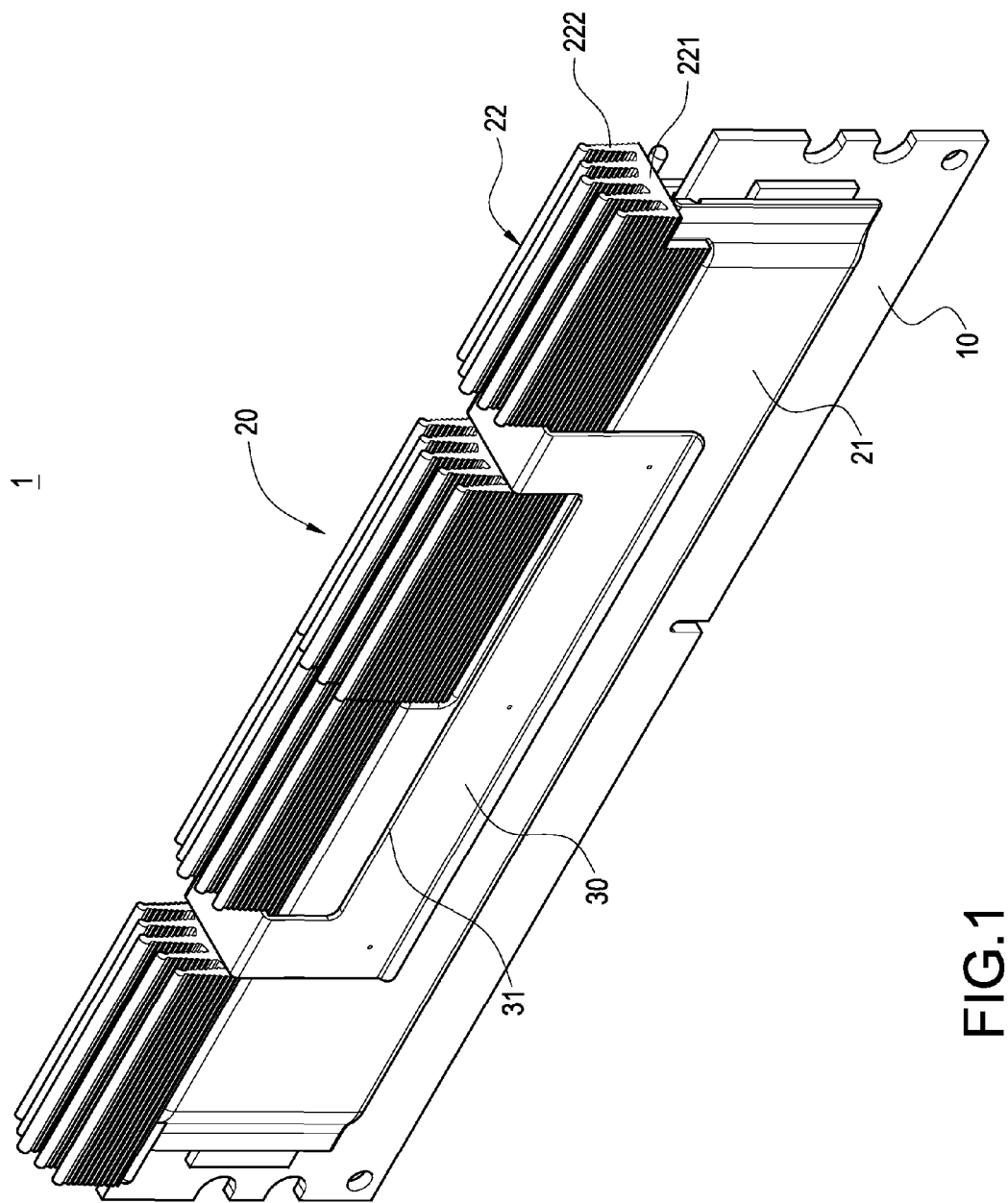
FIG. 1 is a perspective view of a memory device having a heat sink in accordance with the present invention.
Figure 2:
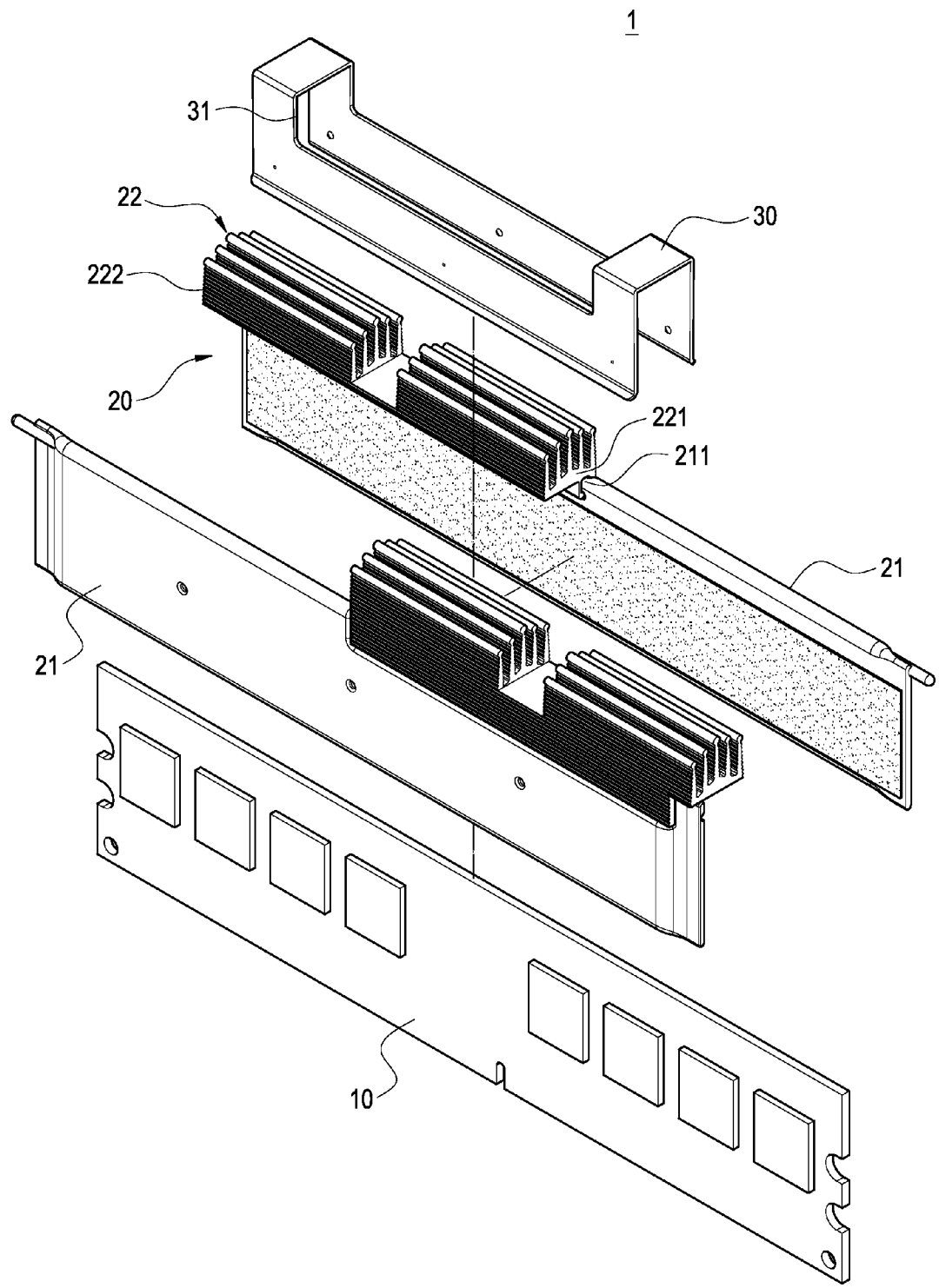
FIG. 2 is an exploded view of a memory device having a heat sink in accordance with the present invention.

With reference to FIGS. 1 and 2 for a perspective view and an exploded view of a memory device having a heat sink in accordance with the present invention, the memory device 1 comprises a memory 10, a heat sink 20 clamped and fixed onto the memory 10, and a clamping element 30.

The heat sink 20 includes an isothermal vapor chamber plate 21 and a heat dissipating body 22. The isothermal vapor chamber plate 21 is attached onto an external side of the memory 10, and the heat dissipating body 22 includes a base plate 221 and a plurality of fins 222 extended from the base plate 221, and the base plate 221 is installed onto the memory 10 and a fin 222 disposed on an internal side of the base plate 221 is higher than a fin 222 disposed on an external side of the base plate 221, and a plurality of wavy protruding stripes are formed on a surface of the fins 222, and a heat conducting medium 23 is coated onto an internal side of the isothermal vapor chamber plate 21, and the heat conducting medium 23 can be a conductive adhesive or a conductive paste.

In this embodiment, an isothermal vapor chamber plate 21 is separately attached onto both external sides of the memory 10, and a heat dissipating body 22 is coupled to each isothermal vapor chamber plate 21, and the clamping element 30 is provided for clamping and fixing the base plate 221 and the isothermal vapor chamber plate 21, wherein the clamping element 30 is a U-shaped elastic plate having a long groove hole 31 formed at the top, and the clamping element 30 is clamped onto the two heat dissipating bodies 22 and the two isothermal vapor chamber plates 21, and the fins 222 of the two heat dissipating bodies 22 are passed into the long groove hole 31.

Figure 3:
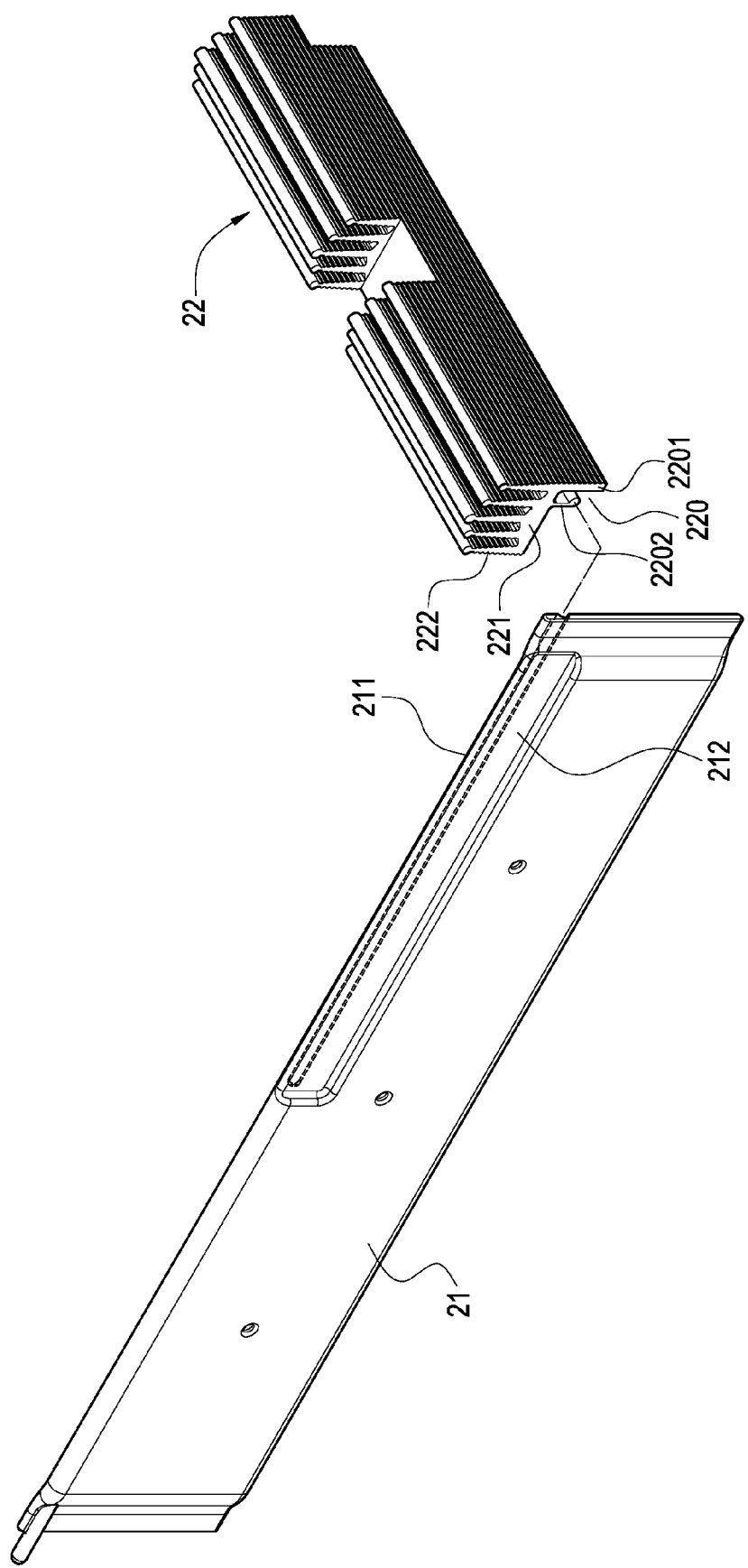
FIG. 3 is a schematic perspective view of a heat sink in accordance with the present invention.
Figure 4:
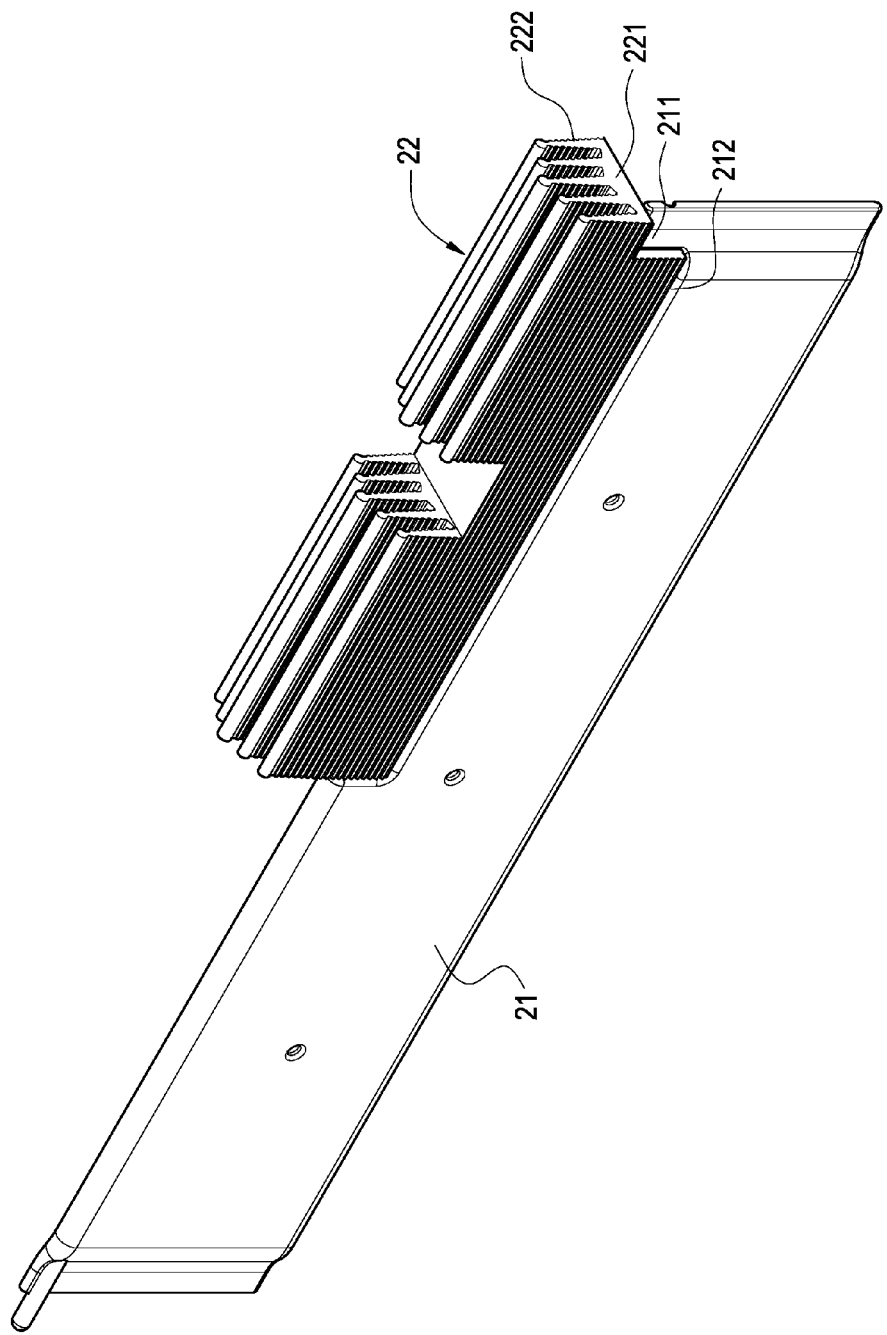
FIG. 4 is a perspective view of a heat sink in accordance with the present invention.
Figure 5:
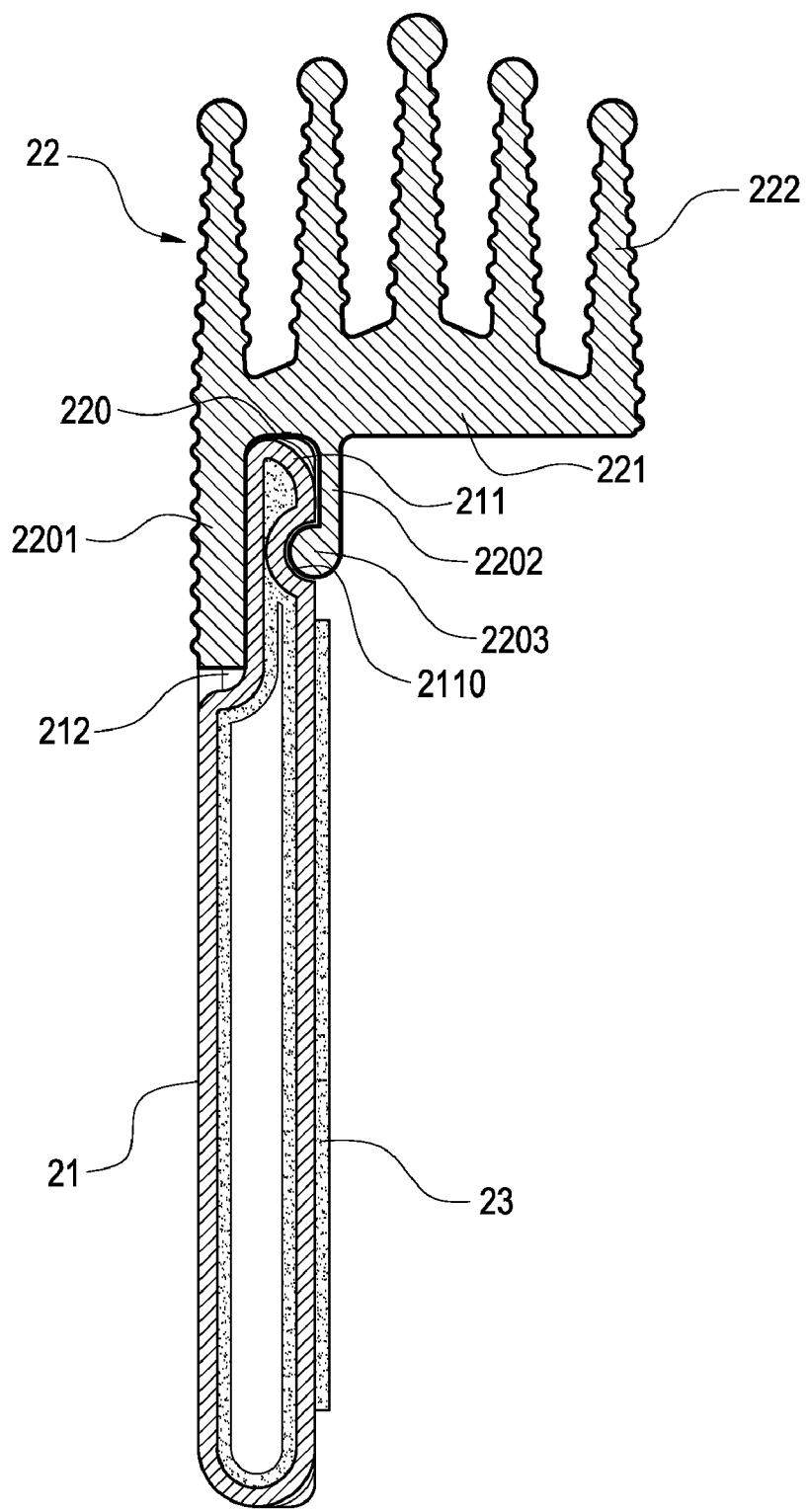
FIG. 5 is a cross-sectional view of a memory device having a heat sink in accordance with the present invention.

With reference to FIGS. 3 to 5 for a schematic view of connecting a replaceable heat sink, a schematic view and a perspective view of the heat sink in accordance with the present invention respectively, the isothermal vapor chamber plate 21 contains a capillary tissue and the working fluid and includes an insert portion 211 formed on a lateral side of the isothermal vapor chamber plate 21 and a concave surface 212 formed on an external side of the isothermal vapor chamber plate 21, and the heat dissipating body 22 further includes a pawl arm 220 extended from the base plate 221 in an opposite direction of the fins 222. In this embodiment, the pawl arm 220 is formed at the bottom surface of the base plate 221, and the pawl arm 220 includes a flat straight section 2201 and a clamping section 2202 disposed on an opposite side of the flat straight section 2201, and the heat dissipating body 22 is coupled to the insert portion 211 in a replaceable manner by the pawl arm 220. When the insert portion 211 is passed into and coupled to the pawl arm 220, the flat straight section 2201 is attached and coupled to the concave surface 212 on an external side of the insert portion 211, such that the external surface of the flat straight section 2201 is aligned evenly with the external surface of the isothermal vapor chamber plate 21, and the clamping section 2202 is clamped onto an internal surface of the insert portion 211. In this embodiment, a slide slot 2110 is formed on an internal surface of the insert portion 211, wherein the clamping section 2202 is an elastic arm in a striped shape and includes a positioning pillar 2203 formed at an end of the clamping section 2202 and slidably coupled and positioned into the slide slot 2110.

Figure 6:
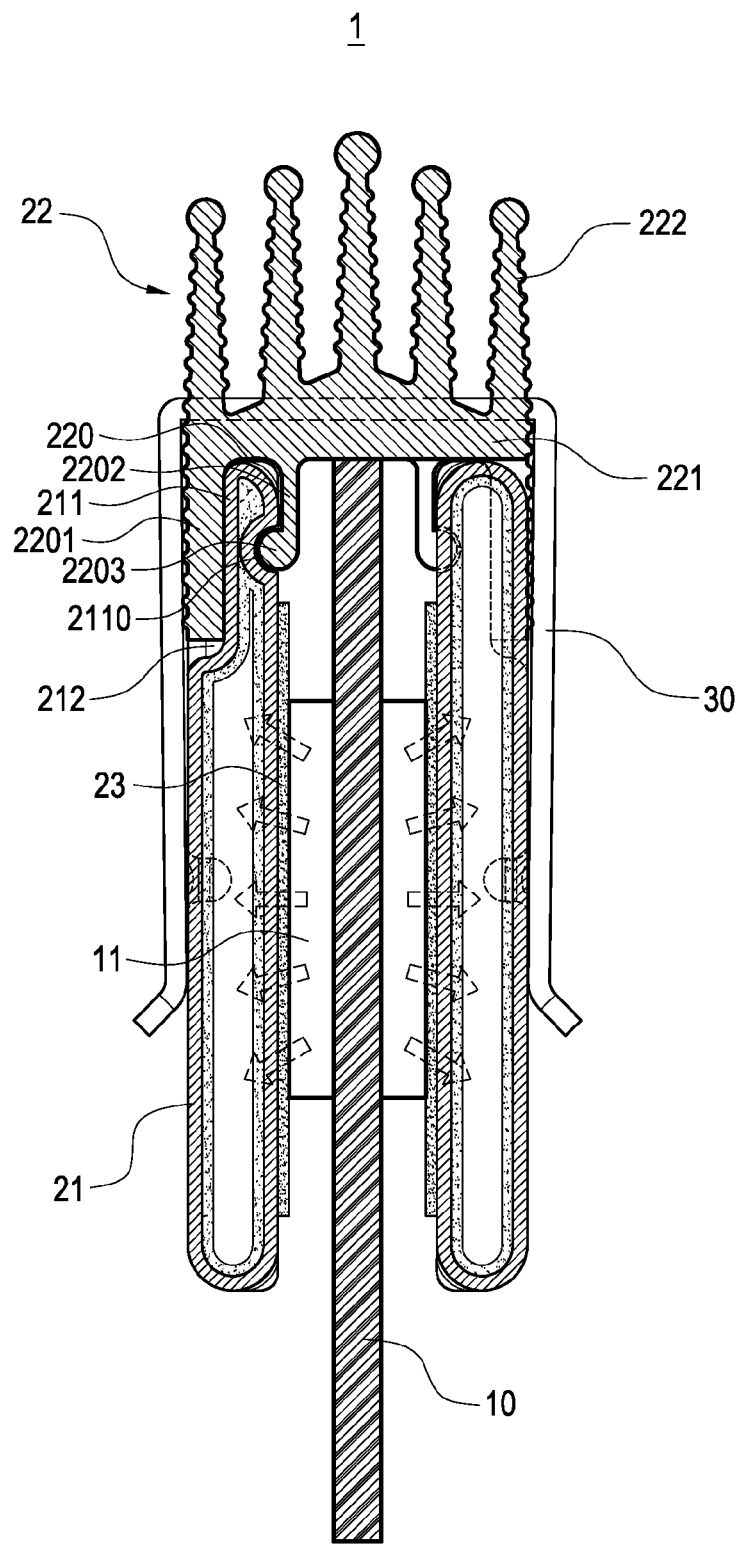
FIG. 6 is a schematic view of an application of a memory device having a heat sink in accordance with the present invention.

With reference to FIG. 6 for a schematic view of applying a memory device having a heat sink in accordance with the present invention, a chip 11 generates heat during the operation of the memory 10, and the heat generated by the chip 11 is conducted from the heat conducting medium 23 to the isothermal vapor chamber plate 21. Since the isothermal vapor chamber plate 21 is passed into the pawl arm 220 of the heat dissipating body 22 and contacted with and coupled to the flat straight section 2201 of the pawl arm 220, therefore the heat is conducted to the fins 222, and finally dissipated from the fins 222 to achieve the heat dissipating function.

While the invention has been described by means of specific embodiments, numerous modifications and variations could be made thereto by those skilled in the art without departing from the scope and spirit of the invention set forth in the claims.

What is claimed is:

1. A heat sink for a memory, comprising:
   an isothermal vapor chamber plate, attached to an external side of the memory, and including an insert portion formed on the isothermal vapor chamber plate; and
   a heat dissipating body, including a base plate, a plurality of fins extended from the base plate, and a pawl arm extended from the base plate and in a direction opposite to the fins, and the heat dissipating body being coupled to the insert portion in a replaceable manner by the pawl arm.

2. The heat sink for a memory as recited in claim 1, wherein the fin disposed on an internal side of the base plate is higher than the fin disposed on an external side of the base plate, and a plurality of wavy protruding stripe are formed on surfaces of each fin.

3. The heat sink for a memory as recited in claim 1, wherein the pawl arm is formed at a bottom surface of the base plate, and the pawl arm includes a flat straight section and a clamping section disposed on an opposite side of the flat straight section, and the flat straight section is attached and coupled to an external surface of the insert portion, and the clamping section is clamped onto an internal surface of the insert portion.

4. The heat sink for a memory as recited in claim 3, wherein the insert portion includes a slide slot formed on an internal surface of the insert portion, and the clamping section is an elastic arm substantially in a stripe shape, and includes a positioning pillar formed at an end of the elastic arm, and the positioning pillar is slidably coupled and positioned into the slide slot.

5. The heat sink for a memory as recited in claim 3, wherein the insert portion includes a concave surface formed on an external surface of the insert portion, and attached and coupled to the flat straight section, and an external surface of the flat straight section is aligned evenly with an external surface of the isothermal vapor chamber plate.

6. A memory device having a heat sink, comprising:
   a memory;
   an isothermal vapor chamber plate, attached onto an external side of the memory and including an insert portion formed on the isothermal vapor chamber plate;
   a heat dissipating body, including a base plate, a plurality of fins extended from the base plate, and a pawl arm extended from the base plate and in a direction opposite to the fins, and the heat dissipating body being coupled to the insert portion in a replaceable manner by the pawl arm; and a clamping element, for clamping and fixing the base plate and the isothermal vapor chamber plate.

7. The memory device having a heat sink as recited in claim 6, wherein the fin disposed on an internal side of the base plate is higher than the fin disposed on an external side of the base plate, and a plurality of wavy protruding stripe are formed on surfaces of each fin.

8. The memory device having a heat sink as recited in claim 6, wherein the pawl arm is formed at a bottom surface of the base plate, and the pawl arm includes a flat straight section and a clamping section disposed on an opposite side of the flat straight section, and the flat straight section is attached and coupled to an external surface of the insert portion, and the clamping section is clamped onto an internal surface of the insert portion.

9. The memory device having a heat sink as recited in claim 8, wherein the insert portion includes a slide slot formed on an internal surface of the insert portion, and the clamping section is an elastic arm substantially in a stripe shape, and includes a positioning pillar formed at an end of the elastic arm, and the positioning pillar is slidably coupled and positioned into the slide slot.

10. The memory device having a heat sink as recited in claim 8, wherein the insert portion includes a concave surface formed on an external surface of the insert portion, and attached and coupled to the flat straight section, and an external surface of the flat straight section is aligned evenly with an external surface of the isothermal vapor chamber plate.

\* \* \* \* \*